United States Patent
Touya et al.

(10) Patent No.: US 8,791,422 B2
(45) Date of Patent: Jul. 29, 2014

(54) CHARGED PARTICLE BEAM WRITING APPARATUS AND CHARGED PARTICLE BEAM WRITING METHOD

(71) Applicant: NuFlare Technology, Inc., Shizuoka (JP)

(72) Inventors: Takanao Touya, Kanagawa (JP); Munehiro Ogasawara, Kanagawa (JP)

(73) Assignee: Nuflare Technology, Inc., Shizuoka (JP)

( * ) Notice: Subject to any disclaimer, the term of this patent is extended or adjusted under 35 U.S.C. 154(b) by 0 days.

(21) Appl. No.: 13/706,903

(22) Filed: Dec. 6, 2012

(65) Prior Publication Data

US 2013/0149646 A1 Jun. 13, 2013

(30) Foreign Application Priority Data

Dec. 7, 2011 (JP) ................................. 2011-267800

(51) Int. Cl.
| | | |
|---|---|---|
| G21K 5/04 | (2006.01) | |
| G21K 5/08 | (2006.01) | |
| H01J 37/317 | (2006.01) | |
| H01J 37/04 | (2006.01) | |

(52) U.S. Cl.
CPC ......... *G21K 5/08* (2013.01); *H01J 2237/31774* (2013.01); *H01J 37/3174* (2013.01); *H01J 2237/31776* (2013.01); *H01J 37/045* (2013.01)
USPC ................... 250/396 R; 250/397; 250/492.1; 250/492.3

(58) Field of Classification Search
CPC ............. G21K 1/00; G21K 1/02; G21K 1/08; G21K 5/04; H01J 3/26; H01J 3/12; H01J 3/18; H01J 3/22; H01J 3/38
USPC .......... 250/396 R, 397, 492.1, 492.2, 492.21, 250/492.22, 492.3
See application file for complete search history.

(56) References Cited

U.S. PATENT DOCUMENTS

| | | | | |
|---|---|---|---|---|
| 5,097,138 | A | * | 3/1992 | Wakabayashi et al. .... 250/492.2 |
| 8,362,427 | B2 | * | 1/2013 | Nishimura et al. ........... 250/310 |
| 2009/0140160 | A1 | * | 6/2009 | Platzgummer et al. ... 250/396 R |
| 2010/0065741 | A1 | * | 3/2010 | Gerthsen et al. .............. 250/311 |

FOREIGN PATENT DOCUMENTS

| | | |
|---|---|---|
| JP | 06-120126 | 4/1994 |
| JP | 08-254814 | 10/1996 |
| JP | 11-354406 | 12/1999 |
| JP | 2002-237441 | 8/2002 |
| KP | 102002-0018950 | 3/2002 |
| KP | 102003-0036786 | 5/2003 |

OTHER PUBLICATIONS

KR Office Action with US Translation dated Dec. 20, 2013, for Application No. 10-2012-0140874.

* cited by examiner

*Primary Examiner* — Nicole Ippolito
(74) *Attorney, Agent, or Firm* — Patterson & Sheridan, LLP

(57) ABSTRACT

Provided is a charged particle beam writing apparatus including a stage which a sample can be mounted thereon, an irradiation unit which emits a charged particle beam to be irradiated on the sample, and an aperture plate which includes a first opening portion to shape the charged particle beam. The aperture plate has a stacked structure of a first member and a second member, and a position of an end portion of the first opening portion in the second member is recessed from the position of the end portion of the first opening portion in the first member.

16 Claims, 10 Drawing Sheets

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from Japanese Patent Applications No. 2011-267800, filed on Dec. 7, 2011, the entire contents of which are incorporated herein by reference.

FIELD OF THE INVENTION

Embodiments described herein relate generally to a charged particle beam writing apparatus and a charged particle beam writing method.

BACKGROUND OF THE INVENTION

A lithography technique is a very important process among semiconductor manufacturing processes by which scaling-down of a semiconductor device is achieved, because the lithography technique is a process that generates a pattern of the device. Recently, according to high integrity of LSI, circuit line width required for a semiconductor device has been reduced year after year. In order to form a desired circuit pattern on the semiconductor device, a highly-accurate master image pattern (sometimes, referred to as a reticle or a mask) is needed. Herein, since an electron beam writing technique intrinsically has excellent resolution, the technique is used to produce a highly-accurate master image pattern.

In the above-described electron beam writing, uniformity of line width in more accurate sample plane, for example, a mask plane is required. Herein, in the electron beam writing, electrons are charged in a deflector, and thus, the electron beam is drifted, so that there occurs a phenomenon that position accuracy of the writing is degraded.

In order to improve the position accuracy of the writing, it is preferable that the drift of the electron beam is suppressed. JP-A H06-120126 discloses a technique of manufacturing an aperture plate by using tungsten having high electron beam blocking ability so as to improve processing accuracy of an opening portion of the aperture plate.

SUMMARY OF THE INVENTION

A charged particle beam writing (or "drawing") apparatus according to one aspect of the present disclosure includes: a stage which a sample can be mounted thereon; an irradiation unit which emits a charged particle beam to be irradiated on the sample; and an aperture plate which includes a first opening portion to shape the charged particle beam, wherein the aperture plate has a stacked (or "laminated") structure of a first member and a second member, and a position of an end portion of the first opening portion in the second member is recessed from the position of the end portion of the first opening portion in the first member.

A charged particle beam writing apparatus according to one aspect of the present disclosure includes: a stage which a sample can be mounted thereon; an irradiation unit which emits a charged particle beam to be irradiated on the sample; and an aperture plate which includes a plurality of opening portions to form multi-beams by allowing a region including all the plurality of opening portions to be irradiated with the charged particle beam and allowing portions of the charged particle beam to pass through the plurality of opening portions, wherein the aperture plate has a stacked structure of a first member and a second member, and a position of an end portion of the opening portion in the second member is recessed from the position of the end portion of the opening portion in first member.

A charged particle beam writing method according to one aspect of the present disclosure includes: mounting a sample on a stage; emitting a charged particle beam to the sample; and shaping the charged particle beam by using an aperture plate including a first opening portion, wherein the aperture plate has a stacked structure of a first member and a second member, and a position of an end portion of the first opening portion in the second member is recessed from the position of the end portion of the first opening portion in the first member.

DETAILED DESCRIPTION OF THE EMBODIMENTS

Figure 1A:
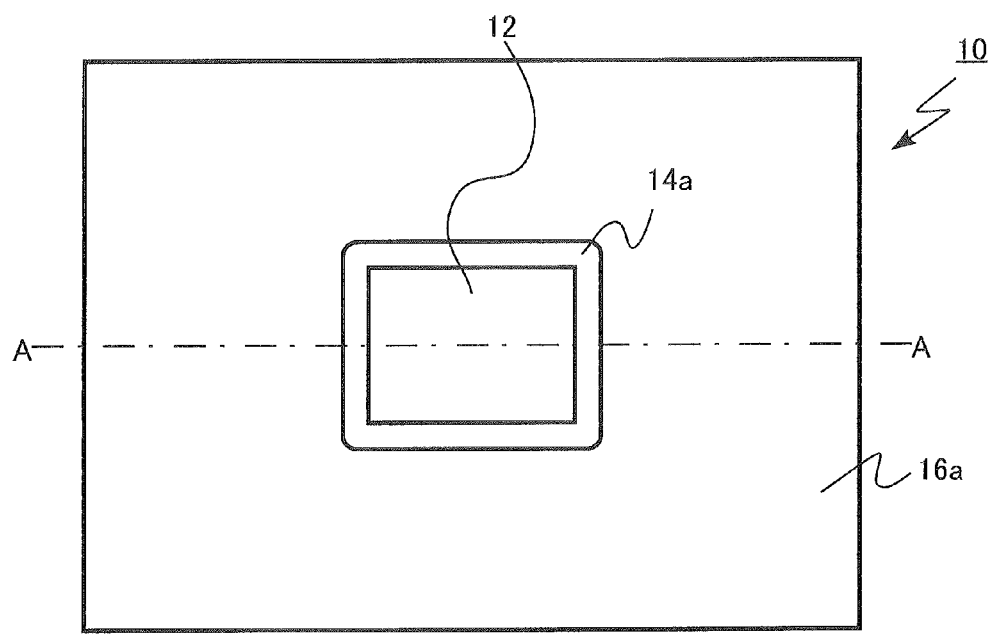
FIGS. 1A and 1B are schematic diagrams illustrating a structure of an aperture plate according to a first embodiment.

As a cause of occurrence of drift of the electron beam, existence of electrons that pass through an aperture plate shaping an electron beam and are scattered may be considered. In order to suppress the scattering of the electrons, one solution may be to make the aperture plate thick. However, there is a problem in that manufacturing accuracy of an end portion (edge portion) of an opening portion of the aperture plate gets worse, and thus, shaping accuracy of the electron beam is degraded.

Hereinafter, the embodiments will be described with reference to the drawings. Hereinafter, in the embodiments, a configuration where an electron beam is used as an example of a charged particle beam will be described. However, the charged particle beam is not limited to the electron beam, but a beam using other charged particles such as an ion beam may be used.

In the specification, writing data is basis data of a pattern which is to be written on a sample. The writing data is data obtained by converting a format of design data generated through CAD or the like by a designer into such a format that the data can be operated and processed in a writing apparatus. A writing pattern of a figure or the like is defined by coordinates of, for example, vertexes of a figure.

In addition, in the specification, in some cases, the same or similar components are denoted by the same reference numerals.

(First Embodiment)

A charged particle beam writing apparatus according to an embodiment includes a stage which a sample can be mounted thereon, an irradiation unit which emits a charged particle beam to be irradiated on the sample, and an aperture plate which includes a first opening portion to shape the charged particle beam, wherein the aperture plate has a stacked structure of a first member and a second member. In addition, a position of an end portion of the first opening portion of the second member is configured to be recessed from the position of the end portion of the first opening portion of the first member.

The charged particle beam writing apparatus according to the embodiment has a stacked structure of the first member and the second member. In addition, the end portion of the opening portion of the first member is configured to thin, so that the processing (or manufacturing) accuracy of the end portion of the opening portion can be secured. On the other hand, the second member of which the position of the end portion of the opening portion is recessed from the position of the end portion of the opening portion in the first member is stacked, so that electron beam blocking ability of the aperture plate can be improved. Therefore, it is possible to suppress electron beam drift occurring due to scattering of the electrons passing through the aperture plate.

Figure 2:
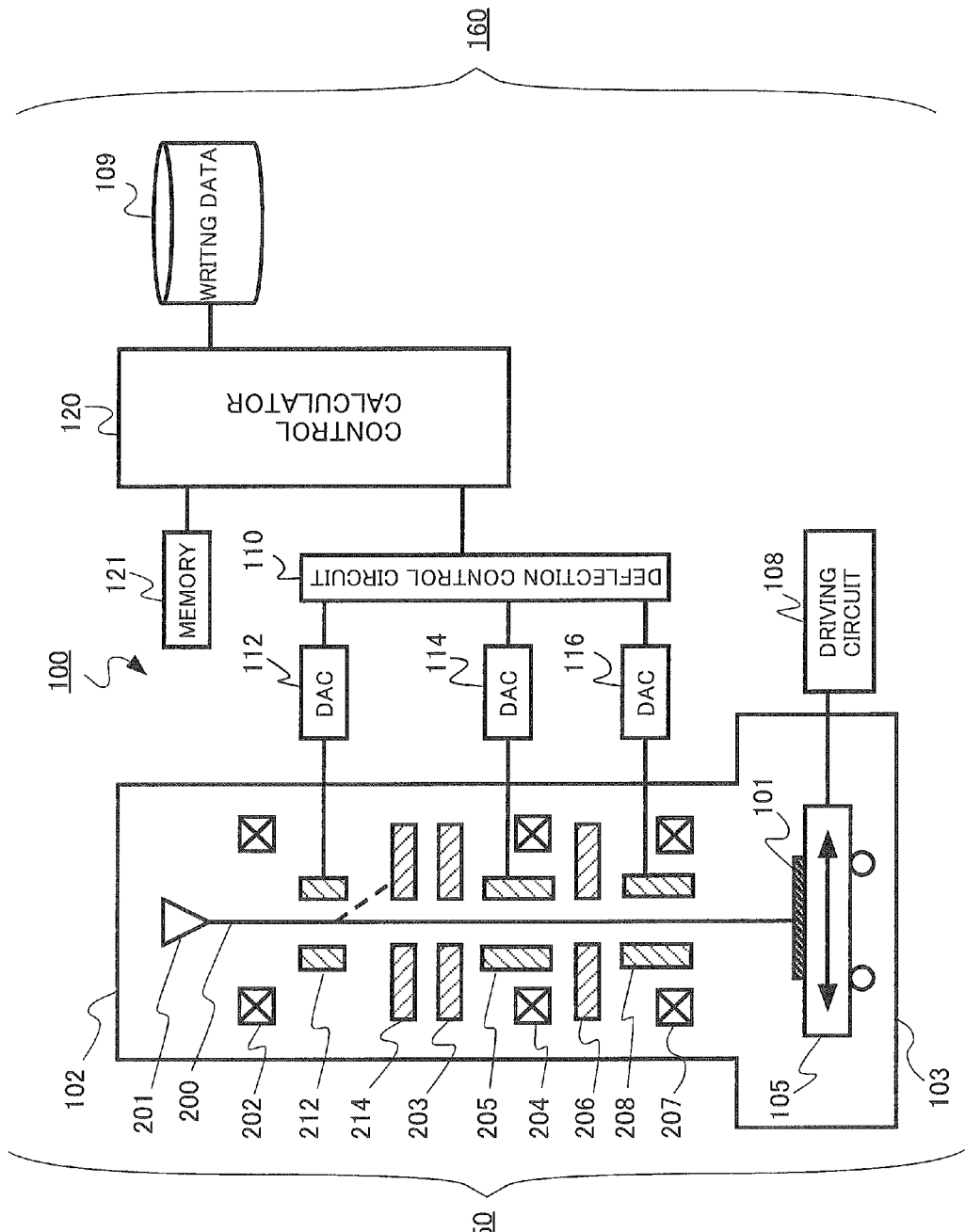
FIG. 2 is a diagram illustrating a concept of a configuration of a writing apparatus according to the first embodiment.

FIG. 2 is a diagram illustrating a concept of a configuration of a writing apparatus according to the embodiment.

As illustrated in FIG. 2, the writing apparatus 100 includes a writing unit 150 and a control unit 160. The writing apparatus 100 is an example of the charged particle beam writing apparatus. The writing apparatus 100 writes a desired pattern on a sample 101.

The writing unit 150 includes an electron barrel 102 and a writing chamber 103. An electron gun 201, an illumination lens 202, a blanking (BLK) deflector 212, a blanking (BLK) aperture plate 214, a first aperture plate 203, the projection lens 204, a deflector 205, a second aperture plate 206, an objective lens 207, and a deflector 208 are disposed within the electron barrel 102.

In addition, an XY stage 105 is movably disposed within the writing chamber 103. In addition, the sample 101 is mounted on the XY stage 105. As an example of the sample 101, there is a mask substrate for an exposing process of transferring a pattern on a wafer. As an example of the mask substrate, there is a blank mask where no image is written.

The control unit 160 includes a driving circuit 108, a magnetic disc device 109, a deflection control circuit 110, digital-to-analog converters (DACs) 112, 114, and 116, a control calculator 120, and a memory 121.

The writing data stored in the magnetic disc device 109 are input to the control calculator 120. Information input to the control calculator 120 or information during or after an operation process is stored in the memory 121 on each occasion.

The memory 121, the deflection control circuit 110, and the magnetic disc device 109 are connected to the control calculator 120 via a bus (not illustrated). The deflection control circuit 110 is connected to DACs 112, 114, and 116. The DAC 112 is connected to the BLK deflector 212. The DAC 114 is connected to the deflector 205. The DAC 116 is connected to the deflector 208.

FIG. 2 illustrates components necessary for describing the embodiment. It is obvious that the writing apparatus 100 typically includes other necessary components.

Figure 3:
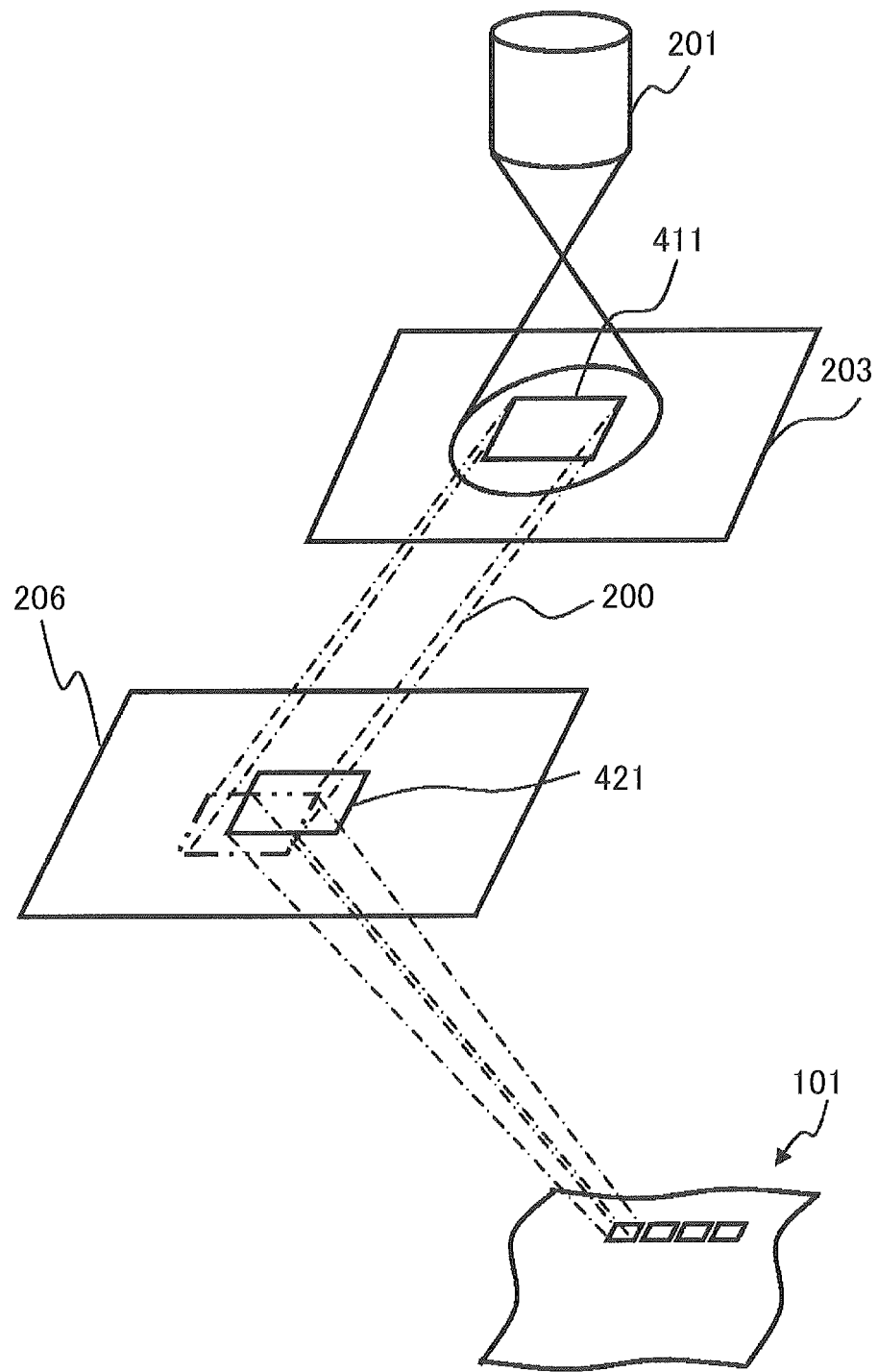
FIG. 3 is a diagram illustrating operations of variable shaping type electron writing according to the first embodiment.

FIG. 3 is a diagram illustrating operations of variable shaping type electron writing according to the embodiment. Hereinafter, the writing method of the writing apparatus 100 will be described with reference to FIGS. 2 and 3.

An electron beam 200 is emitted from the electron gun 201 as an example of the irradiation unit. The electron beam 200 emitted from the electron gun 201 is illuminated on the entire first aperture plate 203 having a rectangular, for example, oblong hole through the illumination lens 202.

A rectangular, for example, oblong opening portion 411 for shaping the electron beam 200 is formed in the first aperture plate 203. Herein, the electron beam 200 is shaped to have an oblong shape.

Next, the electron beam 200 having a first aperture plate image, which passes through the first aperture plate 203, is projected on the second aperture plate 206 through the projection lens 204. An opening portion 421 for shaping the electron beam 200 passing through the opening portion 411 to be in a desired rectangular shape is formed in the second aperture plate 206.

The position of the first aperture plate image on the second aperture plate 206 is controlled to be deflected by the deflector 205 (FIG. 2). Next, the electron beam is allowed to pass through a predetermined portion of the opening portion 421, so that the shape and dimensions of the beam can be changed. As a result, the electron beam 200 is shaped.

Next, the electron beam 200 having a second aperture plate image which passes through the second aperture plate 206 is focused by the objective lens 207 (FIG. 2) and is deflected by the deflector 208. As a result, the electron beam is irradiated on the desired position of the sample 101 on the continuously-moving XY stage 105.

The movement of the XY stage 105 is driven by the driving circuit 108. The deflection voltage of the deflector 205 is controlled by the deflection control circuit 110 and the DAC 114. The deflection voltage of the deflector 208 is controlled by the deflection control circuit 110 and the DAC 116.

In this manner, a rectangular shape which can pass through both of the opening 411 and the variable shaping opening 421 is written in the writing region of the sample 101. A type of forming an arbitrary shape by allowing the shape to pass through both of the opening 411 and the variable shaping opening 421 is called a variable shaping type.

At an irradiation time t when a desired irradiation amount of the electron beam 200 on the sample 101 is incident on the sample 101, blanking is performed as follows. In other words, in order not to irradiate the sample 101 with more than a necessary amount of the electron beam 200, the electron beam 200 is deflected by, for example, an electrostatic type BLK deflector 212, and the electron beam 200 is cut by a BLK aperture plate 214. Therefore, the electron beam 200 does not reach a surface of the sample 101. The deflection voltage of the BLK deflector 212 is controlled by the deflection control circuit 110 and the DAC 112.

In case of beam ON (blanking OFF), the electron beam 200 emitted from the electron gun 201 propagates along a trajectory indicated by a solid line in FIG. 2. On the other hand, in case of beam OFF (blanking ON), the electron beam 200 emitted from the electron gun 201 propagates along a trajectory indicated by a dotted line in FIG. 1. In addition, an inner portion of the electron barrel 102 and an inner portion of the writing chamber 103 are allowed to be in vacuum by a vacuum pump (not illustrated), so that the inner portions thereof are in a vacuum ambience of which the pressure is lower than the atmospheric pressure.

Figure 1B:
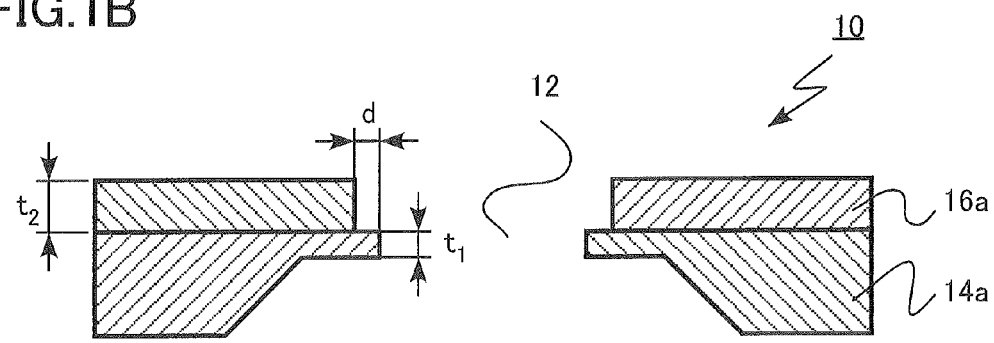

FIGS. 1A and 1B are schematic diagrams illustrating a structure of the aperture plate according to the embodiment. FIG. 1A is a top diagram, and FIG. 1B is a cross-sectional diagram taken along line AA of FIG. 1A.

In the embodiment, the aperture plate 10 of FIGS. 1A and 1B is applied to the first aperture plate 203 and/or the second aperture plate 206 of FIGS. 2 and 3.

The aperture plate 10 includes a first opening portion 12. The electron beam is allowed to pass through the first opening portion 12 to be shaped. In the cross-sectional diagram of FIG. 1B, the size of the first opening portion 12 is in a range of, for example, about 20 µm to about 50 µm.

The aperture plate 10 has a stacked structure of the first member 14a and the second member 16a. In the embodiment, the second member 16a is disposed in the electron gun 201 side. In other words, the upper surface of the second member 16a is configured to be irradiated with the electron beam. Furthermore, the first member 14a may be configured to be disposed in the electron gun 201 side.

The first member 14a and the second member 16a are formed by using the same material, for example, silicon. As a material which can be used for semiconductor processes of the related art during the manufacturing and of which impurities can be suppressed to be at a low concentration, the silicon can be preferably used. Furthermore, a semiconductor such as silicon nitride, silicon carbide, or silicon germanide, a metal, or a metal compound may be used.

In addition, as illustrated in FIG. 1B, the position of the end portion (edge of opening portion) of the first opening portion of the second member 16a is recessed from the position of the end portion (edge of opening portion) of the first opening portion of the first member 14a. In other words, the opening portion of the second member 16a is larger than the opening portion of the first member 14a, and the first member 14a and the second member 16a are so stacked that the end portions of the opening portions do not overlap each other.

Figure 13:
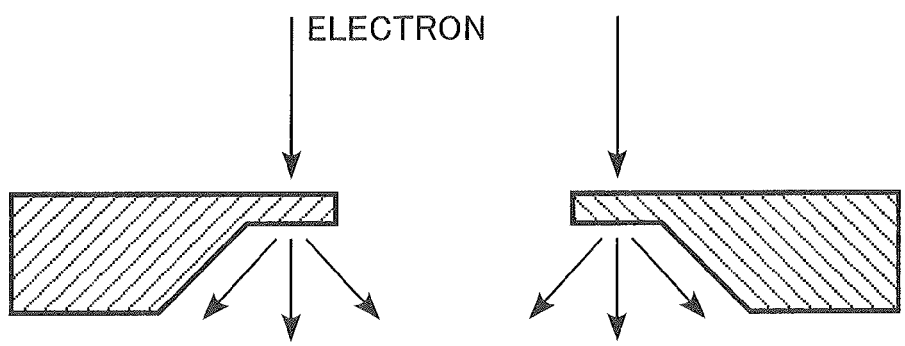
FIG. 13 is a cross-sectional diagram illustrating an aperture plate in the related art.

FIG. 13 is a cross-sectional diagram illustrating an aperture plate in the related art. As illustrated in FIG. 13, in the case where the aperture plate is configured with a single layer and the aperture plate of the end portion of the opening portion is thin, the electrons passing through the aperture plate are scattered and charged in the deflector, so that the drift of the electron beam occurs.

Figure 4:
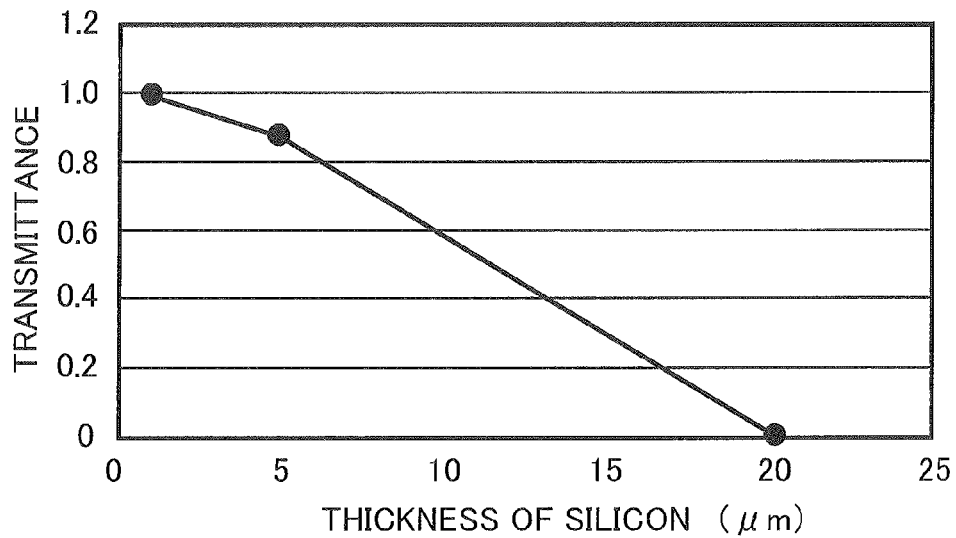
FIG. 4 is a diagram illustrating a relationship between electron transmittance and a thickness of a silicon film.

FIG. 4 is a diagram illustrating a relationship between electron transmittance and a thickness of a silicon film. Incidence energy of an electron is assumed to be 50 keV. As obvious from FIG. 4, in the case where the thickness of the silicon film is 1 µm, the electron transmittance is 100%; and in the case where the thickness of the silicon film is 5 µm, the electron transmittance is close to 90%. However, in the case where the thickness of the silicon film is 20 µm, the electron transmittance is 1% or less. In this manner, in terms of suppression of electron transmission amount, the thickness of the aperture plate of the silicon is preferably 20 µm or more.

Furthermore, if the aperture plate is configured to be thick, the aperture plate is hard to be processed, so that the processing accuracy of the end portion of the opening portion of the aperture plate is deteriorated. Therefore, the beam shaping accuracy is deteriorated, so that the writing accuracy is deteriorated. For example, in order to obtain the processing accuracy suitable for the mask processing for microfine semiconductor products, the thickness of the aperture plate is preferably 5 µm or more.

In the embodiment, the film thickness of the end portion of the opening portion of the first member 14a is configured to be, for example, 5 µm or less by putting the processing accuracy as priority. In addition, the second member 16b of which the film thickness $t_2$ of the end portion of the opening portion is larger than the film thickness $t_1$ of the end portion of the opening portion of the first member 14a is stacked, so that the charged particle beam transmittance of the second member is smaller than that of the first member. Accordingly, it is possible to sufficiently block the electrons from passing. Therefore, it is possible to suppress drift of the electron beam while maintaining the processing accuracy of the edge of the opening portion of the aperture plate.

For example, in the case where the first member 14a and the second member 16a are silicon, a sum of the film thickness $t_1$ and the film thickness $t_2$ is preferably 20 µm or more.

The recessed amount (d in FIG. 1B) of the end portion of the opening portion of the second member 16a from the end portion of the opening portion of the first member 14a is preferably as small as possible in terms of suppression of electron transmission amount. The recessed amount d is preferably 5 µm or less, more preferably, 3 µm or less.

Furthermore, if the recessed amount d is too small, in the case where the first member 14a and the second member 16a are manufactured through adhesion, the adhesion with the recessed amount secured is difficult to perform. Therefore, the recessed amount d is preferably 0.5 µm or more, more preferably, 1 µm or more.

According to the charged particle beam writing apparatus of the embodiment, it is possible to implement the charged particle beam writing apparatus capable of securing shaping accuracy of the charged particle beam and suppressing drift of the charged particle beam. In addition, according to the writing method using the charged particle beam writing apparatus of the embodiment, it is possible to perform writing at high accuracy by securing the shaping accuracy of the charged particle beam and suppressing drift of the charged particle beam.

(Second Embodiment)

The embodiment is the same as the first embodiment except that the first member and the second member are formed by using different materials. Therefore, descriptions on overlapping portions with the first embodiment are not presented.

Figure 5:
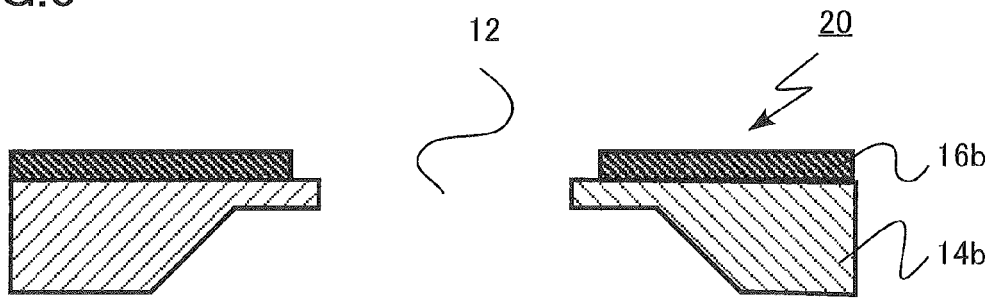
FIG. 5 is a schematic cross-sectional diagram illustrating a structure of an aperture plate according to a second embodiment.

FIG. 5 is a schematic cross-sectional diagram illustrating a structure of an aperture plate according to the embodiment. The first member 14b and the second member 16b of the aperture plate 20 are formed by using different materials. In addition, the electron passage rate of the second member 16b is smaller than the electron transmittance of the first member 14b.

The first member 14b is formed by using, for example, silicon. In addition, the second member 16b is formed by using a material (material having large atomic weight) which electrons are harder to transmit than silicon. For example, a high melting point metal which has high electron blocking ability and cannot easily become contamination sources in the writing apparatus such as molybdenum, tungsten, and tantalum is preferably used.

According to the embodiment, a material which electrons are harder to transmit than the first member 14b is used for the second member 16b, so that the second member 16b can be configured to be thin.

(Third Embodiment)

The embodiment is the same as the first embodiment except that the first member and the second member are formed by using the same manufacturing method. Therefore, descriptions on overlapping portions with the first embodiment are not presented.

Figure 6:
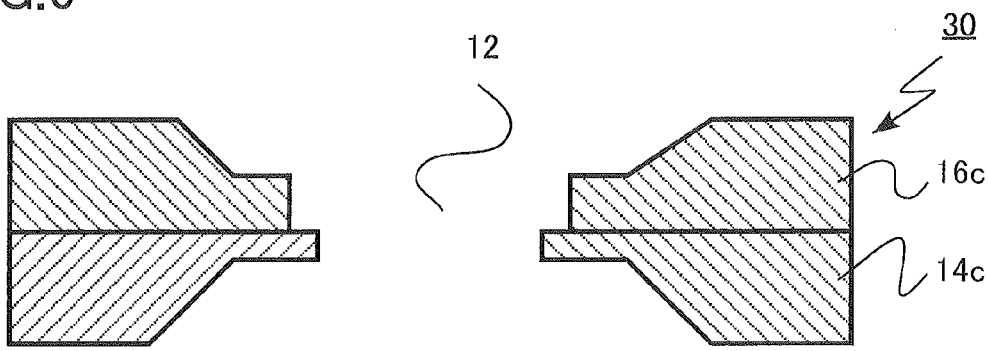
FIG. 6 is a schematic cross-sectional diagram illustrating a structure of an aperture plate according to a third embodiment.

FIG. 6 is a schematic cross-sectional diagram illustrating a structure of an aperture plate according to the embodiment. The first member 14c and the second member 16c of the aperture plate 30 are formed by using the same manufacturing method. Hereinafter, a case where the first member 14c and the second member 16c are formed by using silicon will be described as an example.

Figure 7A:
FIGS. 7A to 7C are diagrams illustrating a method of manufacturing the aperture plate according to the third embodiment.
Figure 7B:
Figure 7C:
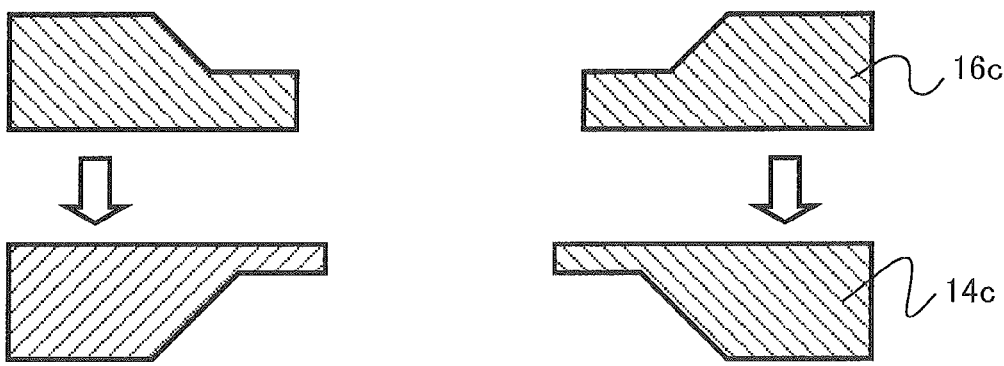

FIGS. 7A to 7C are diagrams illustrating a method of manufacturing the aperture plate according to the embodiment. First, as illustrated in FIG. 7A, the first member 14c is formed by processing a silicon substrate by etching. Next, as illustrated in FIG. 7B, the second member 16c is formed by using the same manufacturing method as the first member 14c. Next, as illustrated in FIG. 7C, the second member 16c is allowed to be oriented in the reverse direction, and the second member 16c is allowed to be adhered to the first member 14c. The adhesion may be performed by using an adhesive. Otherwise, the surfaces of the two members may be polished, and the two members may be adhered to each other by pressure.

According to the embodiment, since the first member 14c and the second member 16c are manufactured in the same process, it is possible to easily manufacture the aperture plate.

(Fourth Embodiment)

The embodiment is the same as the first embodiment except that, in the end portion of the first opening portion, an air gap exists in an interface between the first member and the second member. Therefore, descriptions on overlapping portions with the first embodiment are not presented.

Figure 8:
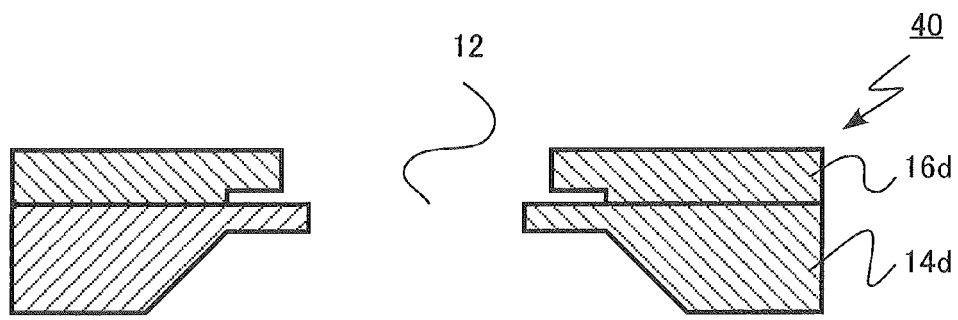
FIG. 8 is a schematic cross-sectional diagram illustrating a structure of an aperture plate according to a fourth embodiment.

FIG. 8 is a schematic cross-sectional diagram illustrating a structure of an aperture plate according to the embodiment. As illustrated in this figure, in the end portion of the first opening portion 12, an air gap is installed in an interface between the first member 14d and the second member 16d.

According to the embodiment, when electrons are blocked by the second member 16d, the second member 16d is heated by the energy of the electrons, and thus, the second member may be thermally deformed. However, since an air gap exist between the second member 16d and the first member 14d, the deformation is not easily transferred to the first member 14d, particularly, the end portion of the opening portion. Therefore, the deformation of the first member 14d cannot easily occur, and deterioration in beam shaping accuracy is suppressed.

The size of the air gap is appropriately determined by considering influence of the heat deformation of the second member 16d on the first member 14d, easiness of the processing, and the like. For example, in FIG. 8, the length of the air gap in the horizontal direction is in a range of 1 µm to 5 µm, and the width of the in the vertical direction is in a range of 0.5 µm to 2 µm.

(Fifth Embodiment)

The embodiment is the same as the first embodiment except that the aperture plate further includes a second opening portion having an area smaller than that of the first opening portion and a third opening portion having the same shape as that of the second opening portion, and positions of the end portions of the second and third opening portions in the second member are recessed from the positions of the end portions of the second and third opening portions in the first member. Therefore, descriptions on overlapping portions with the first embodiment are not presented.

Figure 9A:
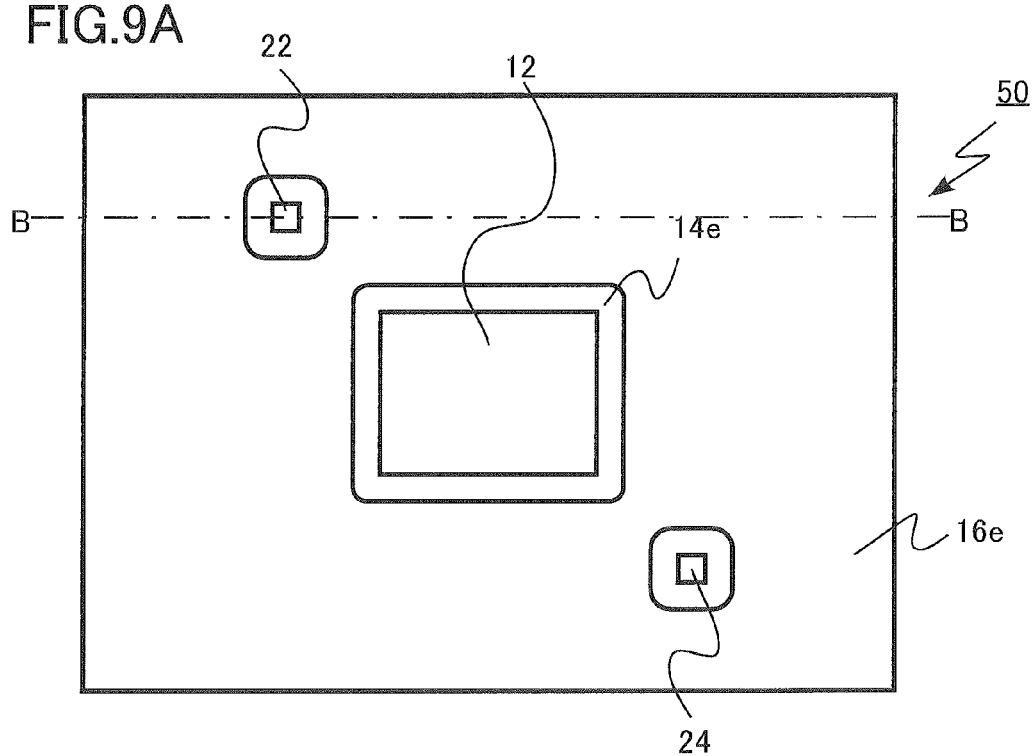
FIGS. 9A and 9B are schematic diagrams illustrating a structure of an aperture plate according to a fifth embodiment.
Figure 9B:
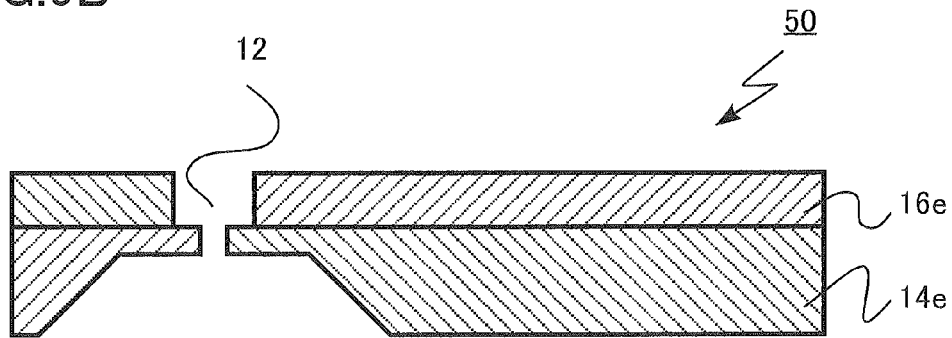

FIGS. 9A and 9B are schematic diagrams illustrating a structure of an aperture plate according to the embodiment. FIG. 9A is a top diagram, and FIG. 9B is a cross-sectional diagram taken along line BB of FIG. 9A.

The aperture plate 50 includes a second opening portion 22 having an area smaller than that of the first opening portion 12 and a third opening portion 24 having the same shape as that of the second opening portion 22. With respect to the second opening portion 22 and the third opening portion 24, when the aperture plate is manufactured by adhering the first member 14e and the second member 16e, the two opening portions function as the alignment marks for the alignment. Therefore, the alignment accuracy of the first member 14e and the second member 16e is improved.

In addition, the second opening portion 22 or the third opening portion 24 having a small area may be used as a monitor mark for monitoring, for example, beam intensity distribution of the electron beam. In terms of the use as a monitor mark, the second and third opening portions 22 and 24 preferably have a square shape or a circular shape. However, the second and third opening portions 22 and 24 may have an oblong shape or other shapes.

In addition, in terms of the use as an alignment mark for the alignment, the sizes of the second and third opening portions 22 and 24 are preferably small. In terms of this point, the sides or diameters of the second and third opening portions 22 and 24 are preferably 1 µm or less.

In addition, a fourth opening portion may be further formed, and thus, three alignment marks are provided, so that the alignment accuracy may be further improved.

According to the embodiment, it is possible to easily manufacture the aperture plate, so that the manufacturing accuracy is improved. Therefore, for example, it is possible to easily reduce the recessed amount of the second member 16e from the end portion of the opening portion of the first member 14e. In addition, it is also possible to monitor an electron beam intensity distribution.

(Sixth Embodiment)

The embodiment is the same as the first embodiment except that the shapes of the opening portions are different. Therefore, descriptions on overlapping portions with the first embodiment are not presented.

Figure 10:
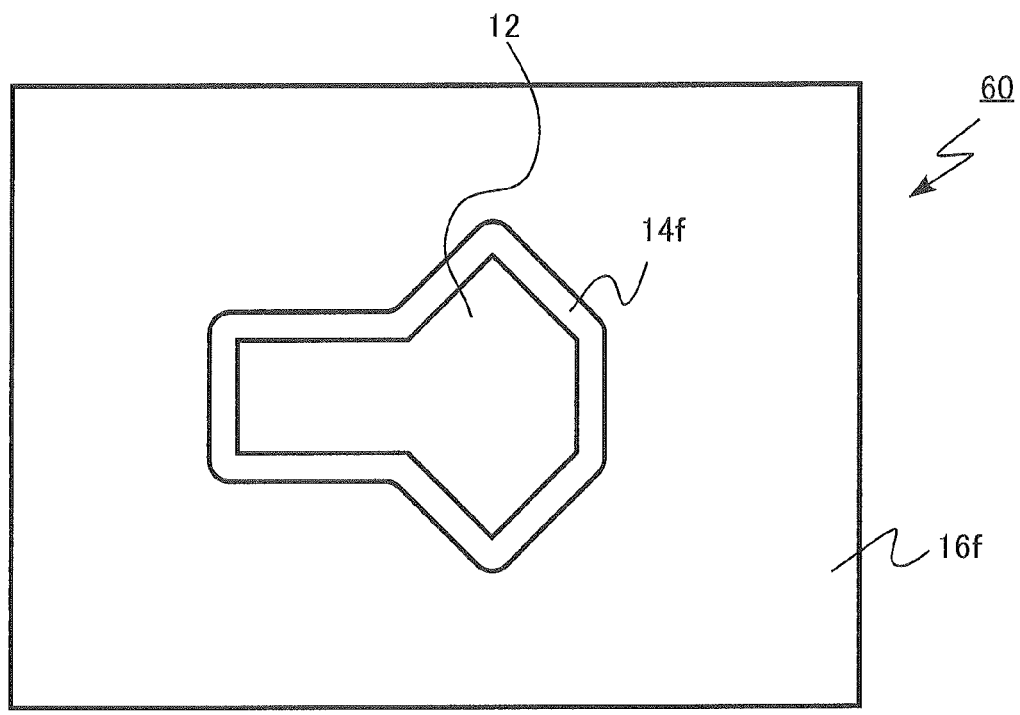
FIG. 10 is a schematic top diagram illustrating a structure of an aperture plate according to a sixth embodiment.

FIG. 10 is a schematic top diagram illustrating a structure of an aperture plate according to the embodiment. The opening portion 12 of the aperture plate 60 does not have a rectangular shape but a combination of a rectangular shape and a hexagonal shape.

According to the embodiment, for example, by further combining one rectangular aperture plate on the upper portion thereof, the electron beam can be shaped in a triangular shape or other polygonal shapes besides the rectangular shape.

(Seventh Embodiment)

A charged particle beam writing apparatus according to the embodiment includes a stage which a sample can be mounted thereon, an irradiation unit which emits a charged particle beam to be irradiated on the sample, and an aperture plate which includes a plurality of opening portions to form multi-beams by allowing a region including all the plurality of opening portions to be irradiated with the charged particle beam and allowing portions of the charged particle beam to pass through the plurality of opening portions. In addition, the aperture plate has a stacked structure of the first member and the second member, and the position of the end portion of the opening portion of the second member is recessed from the position of the end portion of the opening portion of the first member.

The charged particle beam writing apparatus according to the embodiment is a multi-beam type writing apparatus which writes using a plurality of electron beams. In the first to sixth embodiments, the examples of the aperture plate used for variable shaping in which an electron beam is shaped in an arbitrary shape are described. However, the embodiment is different from the first to fifth embodiments in that an aperture plate used for shaping multi-beams is exemplified. With respect to the structure, material, function, and the like of the opening portion of the aperture plate, description of some of the overlapping contents with the first to fifth embodiments will not be presented.

Figure 11:
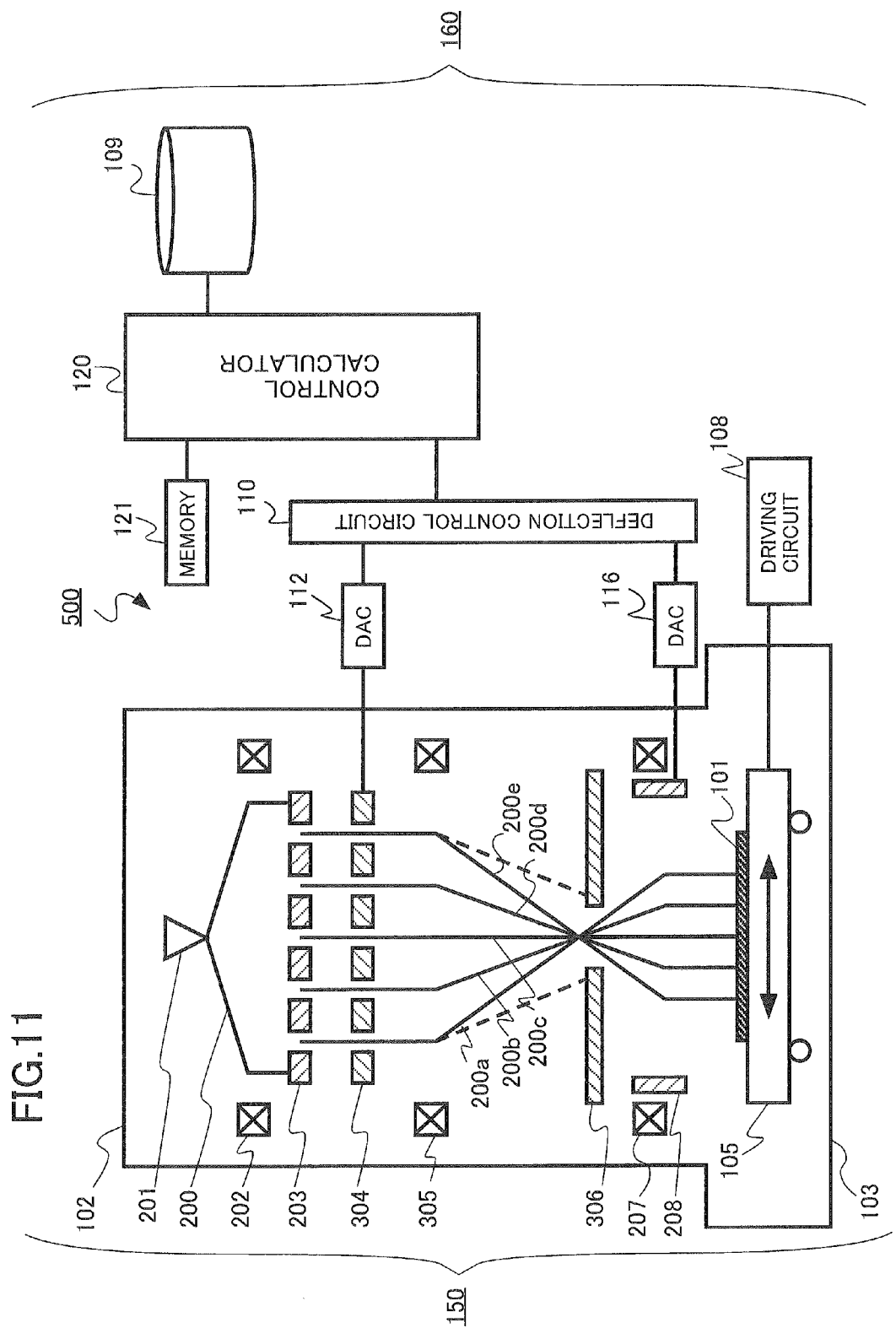
FIG. 11 is a diagram illustrating a concept of a configuration of a writing apparatus according to a seventh embodiment.

FIG. 11 is a diagram illustrating a concept of a configuration of the writing apparatus according to the embodiment.

In FIG. 11, the writing apparatus 500 includes a writing unit 150 and a control unit 160. The writing apparatus 500 is an example of a multi-beam type charged particle beam writing apparatus. The writing apparatus 500 writes a desired pattern on a sample 101.

The writing unit 150 includes an electron barrel 102 and a writing chamber 103. An electron gun 201, an illumination lens 202, an aperture plate 203, a blanking plate 304, a reduction lens 305, a limitation aperture plate member 306, an objective lens 207, and a deflector 208 are disposed within the electron barrel 102.

In addition, an XY stage 105 is movably disposed within the writing chamber 103. In addition, the sample 101 is mounted on the XY stage 105. As an example of the sample 101, there is a mask substrate for an exposing process of transferring a pattern on a wafer. As an example of the mask substrate, there is a blank mask where no image is written.

The control unit 160 includes a driving circuit 108, a magnetic disc device 109, a deflection control circuit 110, digital-to-analog converters (DACs) 112 and 116, a control calculator 120, and a memory 121.

The writing data stored in the magnetic disc device 109 are input to the control calculator 120. Information input to the control calculator 120 or information during an operation process and after the operation process is stored in the memory 121 on each occasion.

The memory 121, the deflection control circuit 110, and the magnetic disc device 109 are connected to the control calculator 120 via a bus (not shown). The deflection control circuit 110 is connected to DACs 112 and 116. The DAC 112 is connected to the blanking plate 304. The DAC 116 is connected to the deflector 208.

FIG. 11 illustrates components necessary for description of the embodiment. It is obvious that the writing apparatus 500 generally includes other necessary components.

Hereinafter, the writing method of the writing apparatus 500 will be described with reference to FIG. 11.

An electron beam 200 is emitted from the electron gun 201 as an example of the irradiation unit. The electron beam 200 emitted from the electron gun 201 is illuminated on the entire aperture plate 203 in almost the vertical direction through the illumination lens 202.

A plurality of rectangular, for example, oblong or square holes (opening portions) are formed in the aperture plate 203, and the electron beam 200 is illuminated on a region including all the plurality of holes. The electron beam is allowed to pass through the plurality of the holes of the aperture plate 203, so that, for example, a plurality of rectangular electron beams (multi-beams) 200a to 200e are formed.

The multi-beams 200a to 200e pass through blankers corresponding to the blanking plates 304. The blankers deflect the electron beams 200a to 200e which individually pass through the blankers.

The multi-beams 200a to 200e passing through the blanking plates 304 are reduced by the reduction lens 305 and propagate toward a central hole formed in the limitation aperture plate member (blanking aperture plate) 306. Herein, the multi-beams 200a to 200e deflected by the blankers of the blanking plates 304 are deviated from the central hole of the limitation aperture plate member 306, so that the multi-beams are blocked by the limitation aperture plate member.

On the other hand, the multi-beams 200a to 200e which are not deflected by the blankers of the blanking plates 304 pass through the central hole of the limitation aperture plate member 306. Blanking control is performed by the on/off of the blankers, so that the on/off of the beams can be controlled.

In this manner, the limitation aperture plate member 306 blocks the beams which are deflected so that the beams are allowed to be in the off states by the plurality of the blankers. Next, a beam of one shot is formed from the beams which are formed in a time interval from the time when the beam allowed to be in the on state to the time when the beam allowed to be in the off state and which pass through the limitation aperture plate member 306.

The multi-beams 200a to 200e passing through the limitation aperture plate member 306 are focused on one point by the objective lens 207 to form a pattern image with a desired reduction ratio. The beams (all the multi-beams 200a to 200e) passing through the limitation aperture plate member 306 are collectively deflected in the same direction by the deflector 208, so that the beams are irradiated on the positions of the sample 101.

In addition, the irradiation position of the beam is controlled by the deflector 208 so that the irradiation position of the beam follows the movement of the XY stage 105, for example, when the XY stage 105 is continuously moved. Ideally, the multi-beams 200a to 200e which are irradiated at one time are arranged at a pitch which is a product of an arrangement pitch of a plurality of the holes of the aperture plate and the above-described desired reduction ratio.

When the writing apparatus 500 performs a writing operation in a raster scan method of continuously irradiating shot beams in sequence to write a desired pattern, unnecessary beams are controlled through blanking control so as to be in the beam off state.

Figure 12A:
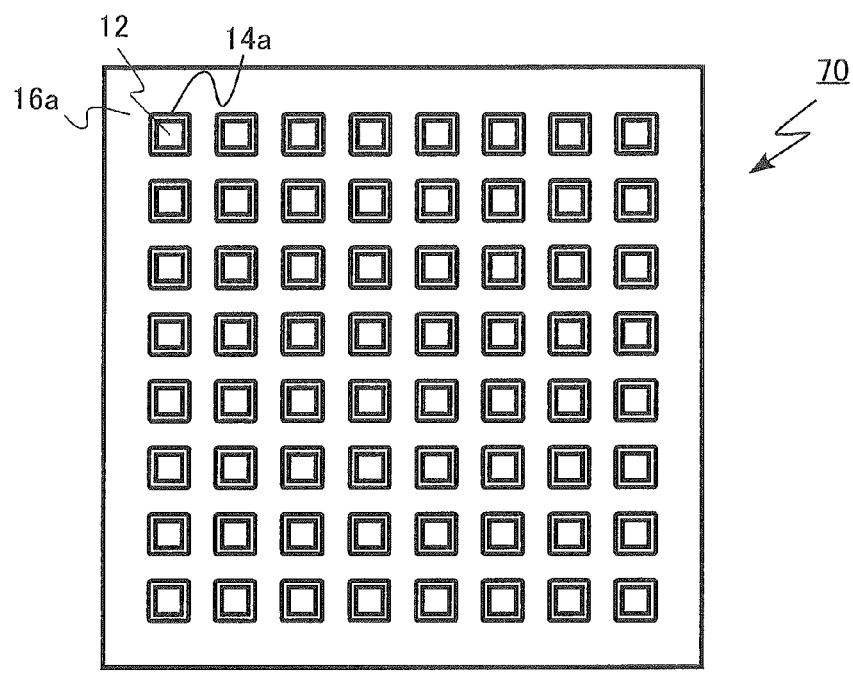
FIGS. 12A and 12B are schematic diagrams illustrating a structure of an aperture plate according to the first embodiment.
Figure 12B:
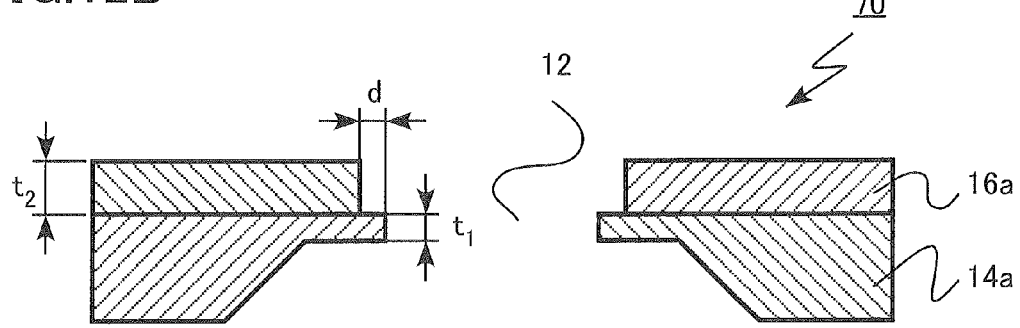

FIGS. 12A and 12B are schematic diagrams illustrating a structure of an aperture plate according to the embodiment. FIG. 12A is a top diagram, and FIG. 12B is a cross-sectional diagram illustrating one opening portion.

In the embodiment, an aperture plate 70 of FIGS. 12A and 12B is applied to the aperture plate 203 of FIG. 11.

Holes (opening portions) 12 of vertical (y direction) m rows×horizontal (x direction) n columns (m, n≥2) are formed with a predetermined arrangement pitch in the aperture plate 70. In FIG. 12A, for example, 8×8 opening portions 12 are formed. The opening portions 12 are formed to have the same rectangular shapes, for example, oblong shapes or square shapes having the same dimensions. Alternatively, the opening portions 12 may be formed to have circular shapes having the same outer diameter.

Portions of the electron beam 200 are allowed to pass through the plurality of the opening portions 12, so that the multi-beams 200a to 200e are formed.

In addition, with respect to the arrangement of the opening portions, although the example where the same number of opening portions are arranged in the horizontal and vertical directions are described as illustrated in FIG. 12A, the embodiment is not limited to the arrangement. For example, different numbers of the opening portions may be arranged in the horizontal and vertical directions. In addition, for example, the opening portions of the adjacent horizontal columns or vertical rows may be arranged to be deviated by a predetermined dimension.

As illustrated in FIG. 12B, similarly to the first embodiment, the aperture plate 70 has a stacked structure of the first member 14a and the second member 16a. In the embodiment, the second member 16a is disposed on the side of the electron gun 201. In other words, the upper surface of the second member 16a is configured to be irradiated with the electron beam.

The first member 14a and the second member 16a are formed by using the same material, for example, silicon. As a material which can be used for existing semiconductor processes during the manufacturing and of which impurities can be reduced, the silicon can be preferably used. Furthermore, a semiconductor such as silicon nitride, silicon carbide, or silicon germanide, a metal, or a metal compound may be used.

In addition, as illustrated in FIG. 12B, the position of the end portion (edge of opening portion) of the first opening portion of the second member 16a is recessed from the position of the end portion (edge of opening portion) of the first opening portion of the first member 14a. In other words, the opening portion of the second member 16a is larger than the opening portion of the first member 14a, and the first member 14a and the second member 16a are stacked so that the end portions of the opening portions thereof do not overlap each other.

According to the charged particle beam writing apparatus of the embodiment, it is possible to implement the charged particle beam writing apparatus capable of securing shaping accuracy of the multi-beams and suppressing drift of the charged particle beam. In addition, according to the writing method using the charged particle beam writing apparatus of the embodiment, it is possible to perform writing at high accuracy by securing the shaping accuracy of the multi-beams and suppressing drift of the charged particle beam.

In addition, herein, although the case in which the same structure as that of the first embodiment is applied to the opening portion of the aperture plate of the multi-beam type writing apparatus are described as an example, the same structures as those of the second or fifth embodiments may be applied.

Hereinbefore, the embodiments are described with reference to specific examples. However, the present disclosure is not limited to the specific examples.

In addition, although description of components such as configurations of an apparatus or control methods which are not directly needed for the description of the present disclosure is not presented, necessary configurations of the apparatus and necessary control methods may be appropriately selected to be used. For example, although description of configurations of the control unit of the writing apparatus 100 is not presented, it is obvious that necessary configurations of the control unit may be appropriately selected to be used.

In addition, all charged particle beam writing apparatuses and charged particle beam writing methods, which are configured to include the components of the present disclosure and can be modified in design by the skilled person in the art, belong to the scope of the present disclosure.

What is claimed is:

1. A charged particle beam writing apparatus comprising:
a stage on which a sample can be mounted;
an irradiation unit which emits a charged particle beam to be irradiated on the sample;
an aperture plate which includes a first opening portion to shape the charged particle beam; and
an objective lens provided between the stage and the aperture plate,
wherein the aperture plate has a stacked structure of a first member and a second member, the second member being stacked on and adhered to the first member, position of an end portion of the first opening portion in the second member is recessed from the position of an end portion of the first opening portion in the first member by between 0.5 µm and 5 µm, and a portion of the first member protruding into the first opening portion and having no portion of the second member stacked thereon has a substantially uniform thickness.

2. The charged particle beam writing apparatus according to claim 1, wherein a charged particle beam transmittance of the second member is smaller than that of the first member.

3. The charged particle beam writing apparatus according to claim 1, wherein the aperture plate further includes a second opening portion having an area smaller than that of the first opening portion and a third opening portion having the same shape as that of the second opening portion, and positions of end portions of the second and third opening portions in the second member are respectively recessed from the positions of end portions of the second and third opening portions in the first member.

4. The charged particle beam writing apparatus according to claim 1, wherein, in the end portion of the first opening portion, an air gap exists in an interface between the first member and the second member.

5. The charged particle beam writing apparatus according to claim 1, wherein the first and second members are formed of the same material.

6. The charged particle beam writing apparatus according to claim 5, wherein the first and second members are formed of silicon.

7. The charged particle beam writing apparatus according to claim 1, wherein the first and second members are formed of different materials.

8. The charged particle beam writing apparatus according to claim 7, wherein the first member is formed of silicon, and the second member is formed of molybdenum, tungsten, or tantalum.

9. A charged particle beam writing apparatus comprising:
a stage on which a sample can be mounted;
an irradiation unit which emits a charged particle beam to be irradiated on the sample;
an aperture plate which includes a plurality of opening portions to form multi-beams by allowing a region including all the plurality of opening portions to be irradiated with the charged particle beam and allowing portions of the charged particle beam to pass through the plurality of opening portions: and
an objective lens provided between the stage and the aperture plate,
wherein the aperture plate has a stacked structure of a first member and a second member, the second member being stacked on and adhered to the first member, position of an end portion of each of the opening portions in the second member is recessed from the position of an end portion of the same opening portion in the first member by between 0.5 µm and 5 µm, and a portion of the first member protruding into the first opening portion and having no portion of the second member stacked thereon has a substantially uniform thickness.

10. The charged particle beam writing apparatus according to claim 9, wherein a charged particle beam transmittance of the second member is smaller than that of the first member.

11. The charged particle beam writing apparatus according to claim 9, wherein, in the end portion of the first opening portion, an air gap exists in an interface between the first member and the second member.

12. The charged particle beam writing apparatus according to claim 9, wherein the plurality of opening portions each have the same dimension and shape.

13. The charged particle beam writing apparatus according to claim 9, wherein the first and second members are formed of the same material.

14. The charged particle beam writing apparatus according to claim 13, wherein the first and second members are formed of silicon.

15. The charged particle beam writing apparatus according to claim 9, wherein the first and second members are formed of different materials.

16. The charged particle beam writing apparatus according to claim 15, wherein the first member is formed of silicon, and the second member is formed molybdenum, tungsten, or tantalum.

* * * * *